United States Patent
Chan et al.

(10) Patent No.: US 6,727,517 B2
(45) Date of Patent: Apr. 27, 2004

(54) THREE DIMENSIONAL INTEGRATED CIRCUITS

(75) Inventors: Man-Sun John Chan, Causeway Bay (HK); Philip C. H. Chan, Kowloon (HK); Wing-Chung Victor Chan, Sham Shui Po (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 09/964,530

(22) Filed: Sep. 28, 2001

(65) Prior Publication Data

US 2003/0068871 A1 Apr. 10, 2003

(51) Int. Cl.⁷ .............................................. H01L 31/112
(52) U.S. Cl. .............................. 257/66; 257/72; 257/75; 438/660; 438/166; 438/489
(58) Field of Search ................................. 438/660, 166, 438/164, 162, 149, 486, 487, 488; 257/66, 72, 75

(56) References Cited

U.S. PATENT DOCUMENTS

| | | |
|---|---|---|
| 5,508,533 A | 4/1996 | Takemura |
| 5,616,506 A | 4/1997 | Takemura |
| 5,637,515 A | 6/1997 | Takemura |
| 5,707,744 A | 1/1998 | King et al. |
| 5,714,394 A | 2/1998 | Kadosh et al. |
| 5,753,544 A | 5/1998 | Cho et al. |
| 5,834,354 A | 11/1998 | Kadosh et al. |
| 5,837,569 A * | 11/1998 | Makita et al. .............. 438/166 |
| 5,872,029 A | 2/1999 | Gardner et al. |
| 6,025,633 A | 2/2000 | Kadosh et al. |
| 6,207,481 B1 * | 3/2001 | Yi et al. ..................... 438/166 |

FOREIGN PATENT DOCUMENTS

WO   WO98/57372   * 12/1998

* cited by examiner

Primary Examiner—Caridad Everhart
(74) Attorney, Agent, or Firm—Burns, Doane, Swecker & Mathis, L.L.P.

(57) ABSTRACT

Semiconductor crystal grains are formed by metal-induced lateral crystallisation. The positions of the grain boundaries normal to the crystallisation direction are controlled, to position the grains correctly for subsequent formation of electronic devices within them. In a first technique, the grains are positioned by depositing the metal in short strips which each induce the crystallisation of a single corresponding grain. In a second technique, the grains are positioned by pre-patterning the amorphous silicon which is used to form the grains. Electronic circuit elements can be formed in each grain. The resultant structure can be used in a microelectronic mechanical system. Several grains can be formed successively and circuit elements formed in each layer to form a three-dimensional integrated circuit.

23 Claims, 5 Drawing Sheets

THREE DIMENSIONAL INTEGRATED CIRCUITS

FIELD OF THE INVENTION

The present invention relates to a method for fabricating integrated circuits. The invention further relates to apparatus for performing the method, and to integrated circuit products of the fabrication method.

BACKGROUND OF THE INVENTION

It is widely believed that the future of integrated circuits (IC) lies in three-dimensional structures. It is hoped that multiple layer IC circuits will have all the advantages of SOI devices and many other advantages. Specifically, their cell area will be reduced and their circuit density improved. Also, total interconnect lengths are shortened by using vertical connections, thus lowering the RC delay and power consumption.

Such known devices employ a vertical "multi-floor" structure in which multiple layers are separated from their neighbouring layers by insulating films. One of the challenges in developing 3-D technology is to build high quality single crystallised silicon on an insulating material to form the second layer and beyond. Several methods have been reported, such as laser recrystallisation [1], and selective lateral overgrowth epitaxy [2]. However, the methods mentioned are complicated and may cause dislocation defects. Another recent method uses a germanium seed to recrystallize the polysilicon film laterally, but the grain size is limited to few microns [3].

A new recrystallization technique called Metal Induced Lateral Crystallization (MILC) has been proposed [4] to form a high quality silicon film in which thin film transistors (TFT) can be formed. Initially, a 3000 Angstroms layer of oxide is formed on a silicon wafer. 1000 Angstroms of amorphous silicon was deposited at 550° C., followed by 3000 Angstroms of low temperature oxide (LTO). An elongate trench was then opened next to the desired region for crystallisation, and 100 Angstroms of Ni was deposited in a layer covering the surface of the structure and in particular covering the bottom and side walls of the trench. Lateral crystallisation was carried out at 550° C. for 25 hours. It was found that crystallisation of the amorphous silicon proceeded to either side of the trench such that the interface between the crystallised and amorphous silicon gradually moved away from the trench (analogous to a spreading wavefront) at about 2.5 micrometers per hour. The Ni and LTO were then completely removed, and the wafers subsequently annealed at 900° C. for 30 minutes to enlarge the silicon grains. Conventional techniques were then used to form NMOS and PMOS transistors in the grains, and it was found that the grains were large enough that most devices having a 1 micrometer channel length and a channel direction perpendicular to the length direction of the trench, were substantially in a single grain and thus exhibited useful properties. However, devices with a longer channel (e.g. 9 micrometers) could not be formed entirely within a single grain, Furthermore, devices in which the channel length was parallel to the trench length could not be formed entirely within a single grain, even if the channel length was as short as 1 micrometer, since in this direction grain boundaries occurred at random positions. The authors mentioned a couple of applications for the proposed TFTs, including forming 3-D stacked circuits.

SUMMARY OF THE INVENTION

The present invention aims to provide new and useful methods and apparatus for integrated circuit fabrication.

In general terms, the present invention proposes that metal-induced lateral crystallisation is performed while controlling the positions of the grain boundaries normal to the crystallisation direction. By doing this, it can be ensured that the grains are correctly positioned for subsequent formation of electronic devices within them.

In a first technique, the grains are positioned by depositing the metal which induces the crystallisation in strips which are only as long as corresponding achievable grains. In other words, each grain is formed due to a corresponding strip, and in a position corresponding to the location of the strip.

In a second technique, which may be used in combination with the first technique, the grains are positioned by a patterning of the amorphous semiconductor which is to be used to form the grains.

Although the invention can be expressed in terms of methods for forming integrated circuits, it also covers apparatus adapted to perform the methods, and to the products of the methods.

The present invention makes it possible to fabricate electronic circuit elements, especially transistors, in a simple and flexible manner.

It further makes it possible to fabricate 3 dimensional structures which, unlike existing 3D structures, may have any number of layers of circuit elements, not just two.

Also, the present invention may be performed without the use of special processing technology. It is compatible with current 2D technology.

Since transistors can be precisely located on a crystal grain, transistors with single crystal performance can be formed on polysilicon films with precise control. Thus, the present invention makes it possible to solve the problem of poor performance of transistors formed on polysilicon film.

Furthermore, the present invention makes it possible for one or more layers of circuit elements to be formed on top of any existing structure, such as MEMS (micro-electrical mechanical systems). The underlying structures may, for example, me planar or non-planar.

BRIEF DESCRIPTION OF THE FIGS.

Embodiments of the invention will now be described for the sake of example only with reference to the following figures in which:

FIG. 1, which is composed of FIGS. 1(a) to 1(e) shows the stages of constructing a multilayer structure in the embodiment;

Figure 5A:
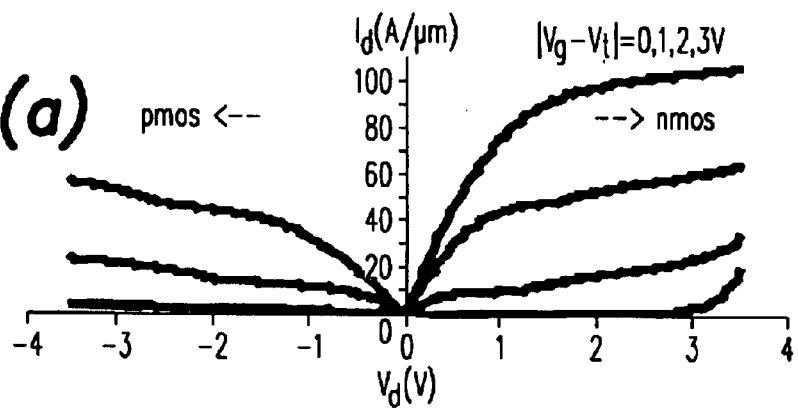
Figure 5B:
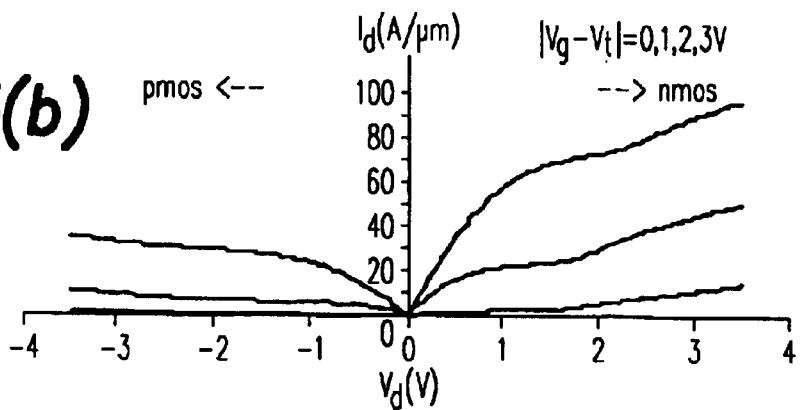
Figure 6:
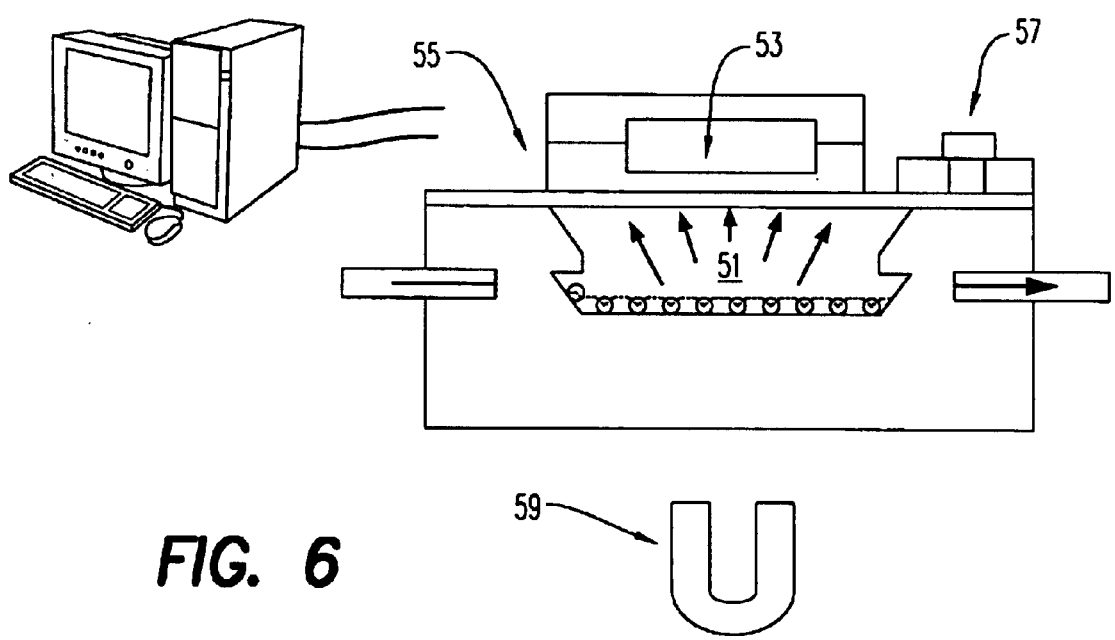

FIG. 5, which is composed of FIGS. 5(a) and 5(b), shows characteristics of transistor devices formed by the embodiment; and FIG. 6 shows a system including circuit elements formed by a method which is an embodiment of the invention.

DETAILED DESCRIPTION OF THE EMBODIMENT

Referring firstly to FIG. 1, a technique for building up multilayer IC devices will be described.

Figure 1A:
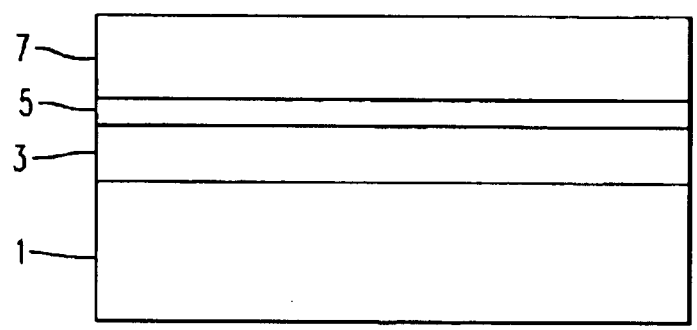

Initially, as shown in FIG. 1(a), an insulating oxide layer 3 is grown or deposited on a silicon wafer 1. A thin layer of amorphous silicon 5 is formed on the oxide 3.

Optionally, as described below with reference to FIG. 3, the amorphous silicon 5 can be patterned to form silicon islands in locations where it is desired to form a circuit element and slightly larger than the desired transistor areas.

Then a layer 7 of low temperature oxide (LTO) is formed covering the upper surface of the structure.

Figure 1B:
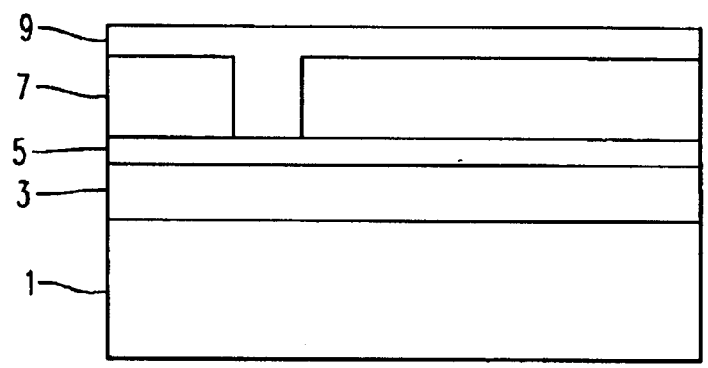
Figure 1C:
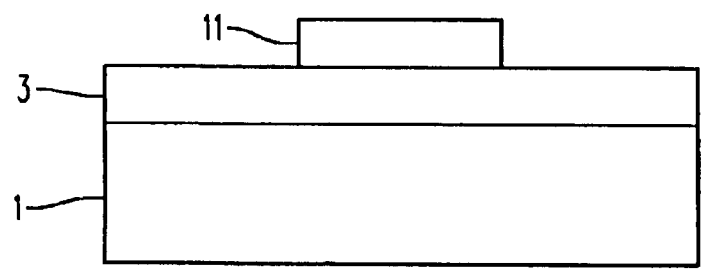

As shown in FIG. 1(b), portions of the LTO are removed, and a layer 9 of metal is deposited. The positions at which the LTO is removed define regions at which the metal layer 9 comes into contact with the amorphous silicon and so is able to initialise lateral crystallisation. As discussed below the regions at which the LTO is removed may be elongate, so that each constitutes a trench. The one or more trenches extend longitudinally in the direction which is into the page in FIG. 1(b), and these trenches may be of a selected length. In FIG. 1(b) the metal layer 9 is shown as substantially filling the removed regions (e.g. trenches) of the LTO, but more normally the metal actually only coats the lower surface of each trench (and typically also its side walls).

The lateral crystallisation is performed for an extended period (e.g. more than an hour, and more preferably several hours) at an intermediate temperature such as 550° C.–625° C.

The metal layer 9 is then removed (although in some embodiments it is possible to retain it), exposing the crystallised silicon of layer 5. Layer 5 is then patterned as desired, to give the silicon islands 11 of the structure shown in FIG. 1(c).

In this embodiment, a second annealing is then performed at an elevated temperature such as 700–1100° C. for a shorter period of time (e.g. 900° C. for 30 minutes, or at most 1 hour). Note that this second annealing step may alternatively if desired be performed before the step of patterning the layer 5.

Further processing steps are performed, for example using conventional methods similar to those of conventional SOI, to form circuit elements 2, 4 in the silicon islands 11. These circuit elements are in a first layer indicated by the arrow A of FIG. 1(d). The circuit elements 2, 4 has a lower layer containing two n$^+$ portions to respectively form the source and drain, spaced by a p$^-$ layer constituting a channel. The channel is covered by a dielectric layer such as an oxide layer, and on top of that a polysilicon gate is formed by deposition. If the oxide is grown, rather than deposited, on the silicon islands 11 it has better quality than known oxides formed on polysilicon.

Further processing steps may also include gate patterning to form the one or more gates, and oxide passivation to form an oxide layer 13. If the devices fabricated have a size comparable to the grain size of the silicon islands 11, the resultant devices have a performance similar to MOSFETs formed on a single crystal of silicon, which is a much better performance than other thin film transistors (TFT) reported.

Figure 1D:
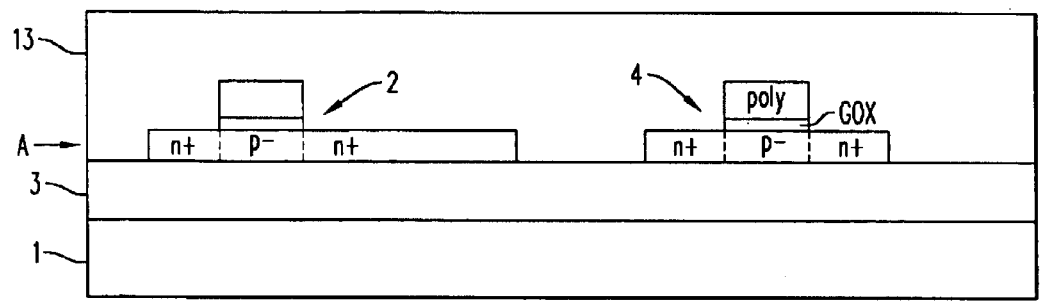
Figure 1E:
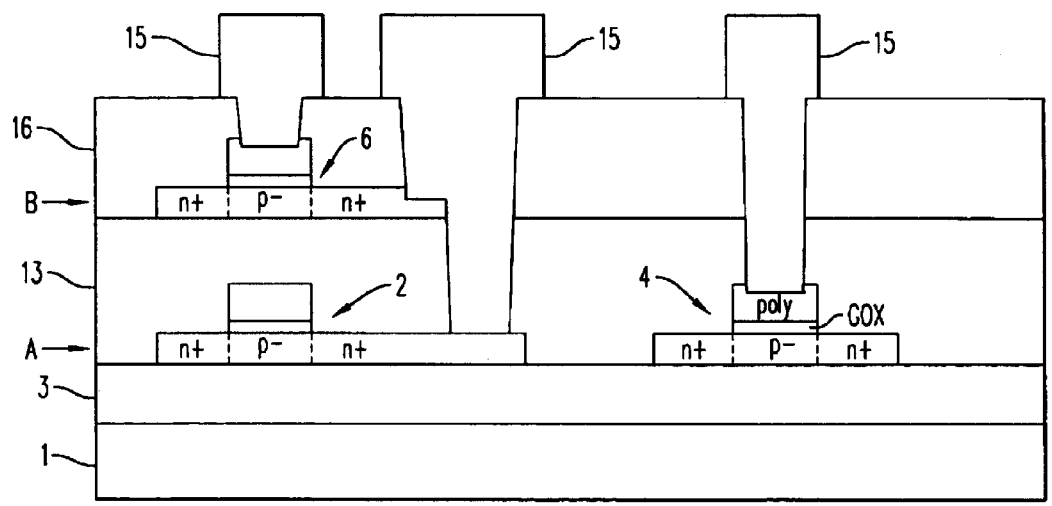

The oxide passivation layer 13 is then subjected to chemical-mechanical polishing to form the structure of FIG. 1(d). The upper surface of the layer 13 constitutes a layer corresponding to layer 2 on which the process described above may be repeated. The result of performing all of the steps described above a second time, and subsequently forming metal contacts 15 by a conventional method, is a structure as shown in FIG. 1(e), in which there is a second layer (indicated by the arrow B) of circuit elements 6 within a second oxide passivation layer 16. The circuit element 6 has a lower layer containing two p$^+$ portions to respectively form the source and drain, spaced by a n$^-$ layer constituting a channel. The channel is covered by an oxide layer, and on top of that a polysilicon gate connected to one of the contacts 15.

The process can be repeated for form one of more further sets of layers 5 to 13.

It should be noted that although in the technique described above there are no circuit elements formed below the layer 3, this is not necessary to the invention. Thus, layers 5 to 13 may be formed on top of a structure (such as a bulk wafer or SOI structure) formed by any (e.g. conventional) method and containing circuit elements.

Figure 2:
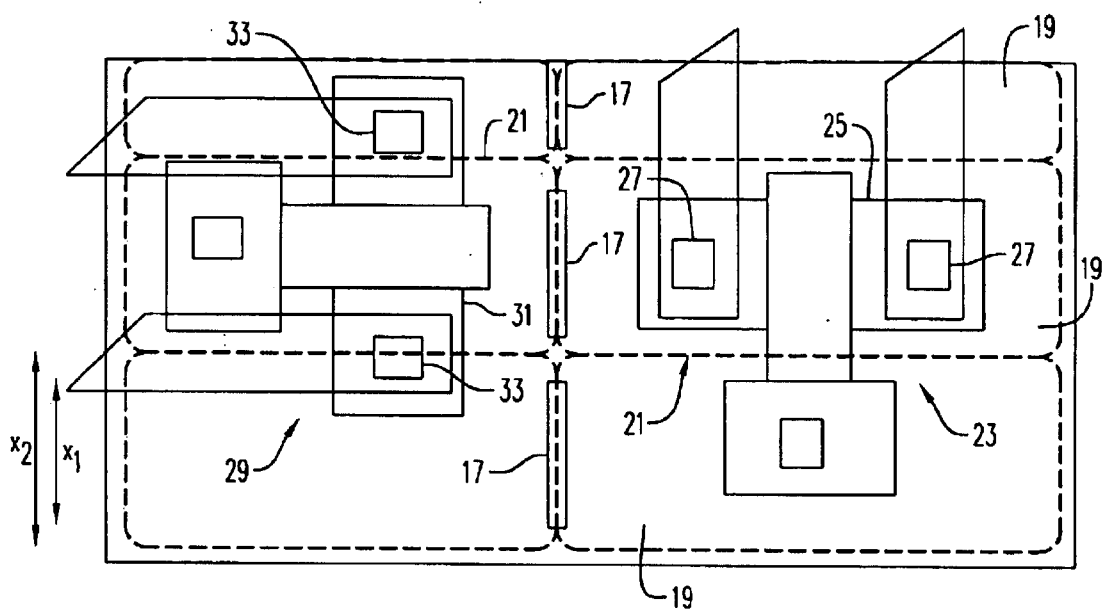
FIG. 2 illustrates a technique used in a first form of the embodiment.

FIG. 2 shows a first technique used in the embodiment to control the grain boundaries within the layer 5, that is in the direction into the page in FIG. 1. FIG. 2 is a view of the structure from the direction which is at the top of FIG. 1. The areas marked as 17 are the areas in which the layer 7 was removed, so that metal 9 could enter to contact the amorphous silicon 5. In other words, each of these areas corresponds to a strip of metal which was present at the stage of the method illustrated in FIG. 1(b), but which has already (preferably) been removed by the stage of the method illustrated in FIGS. 1(d) and 2. In the following discussion these areas 17 will be referred to simply as "strips", and the same applies to the corresponding area 37 in FIGS. 3 and 4 discussed below.

During the annealing stage, each of the strips 17 forms a corresponding single grain 19 extending to either side of the strip. Each strip 17 has a length $x_1$ which is slightly less than the width $x_2$ of a single grain in the direction parallel to the length of the strip 17. The grain boundaries 21 are between the strips, and thus the positions of the grains correspond to the placement of the strips 17.

FIG. 2 also shows two types of transistor devices which can be formed in the embodiment: type A devices, such as 23, having a channel region 25 extending between the source and drain (both marked as 27) in the crystallisation direction (i.e. perpendicular to the length direction of the strips 17); and type B devices, such as 29 having a channel region 31 extending between the source and the drain (both marked as 33) in the direction perpendicular to the crystallisation direction (i.e. parallel to the length direction of the strips 17).

Depending on the length and width of the desired transistor, the orientation of the transistor can be adjusted (e.g. between types A and B) to ensure the entire channel region is located on a single grain.

Another technique to control the location of the grain boundaries is to pre-pattern the silicon islands before depositing the metal. This is shown in FIG. 3, which is in the same orientation as FIG. 2, i.e. from the top of FIG. 1. In this technique portions of layer 5 have been removed to expose the layer 3 except in the island 35. The metal was then deposited in a strip 37 which can be of any length (as explained above in relation to FIG. 2, "strip 37" is used here to mean the area occupied by the strip at stage 1(b) of the method, although the metal has preferably been removed by the stage illustrated in FIGS. 1(d) and 3).

Figure 3:
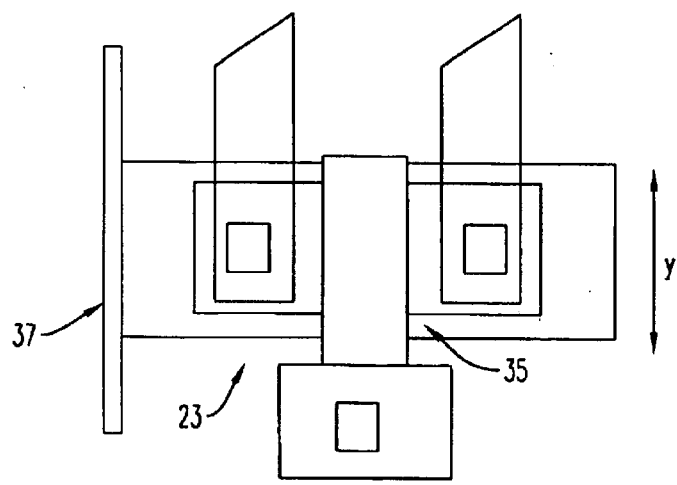
FIG. 3 illustrates a technique used in a second form of the invention.
Figure 4:
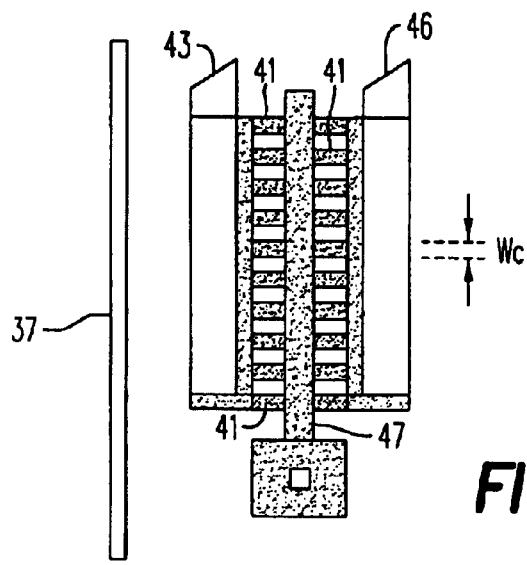
FIG. 4 illustrates a structure produced by the embodiment in its second form.

The island 35 has a width y (i.e. length in the length direction of the strip 37) which is as low as the width perpendicular to the crystallisation direction of a crystal which is achievable by MILC FIG. 3 further shows a type A device 33 formed on the island 35 and having a channel 39 parallel to the crystallisation direction, and entirely on one crystal. This channel cannot be wider than the width y, but if it is desired to form a transistor with a wider channel this can be done as shown in FIG. 4. In this case, a plurality of islands have been formed (the grain boundaries between them are not shown). A source region, channel region 41 and drain region are formed in each island, and the sources regions and drain regions of the different grains are electrically connected by respective conductive strips 43, 45. Similarly, a respective gate is formed over every channel, and the gates connected by a strip 47. The width of each channel region 41 is marked as Wc.

Note that in this document the expression that a layer containing semiconductor crystals "includes" circuit elements is meant to cover all the circuit elements described in FIGS. 2 to 4, i.e. whether the circuit elements are contained within respective grains (as in FIG. 2 or 3) or whether the circuit elements extend over more than one grain (as in FIG. 4). Equivalently, we say that the circuit elements are "formed in" the layer having semiconductor crystals. The term "layer" of semiconductor crystals is used even to include layers (such as shown in FIG. 3) in which the semiconductor crystals are spaced apart.

Having now set out the principles of the embodiment, we will now describe a detailed example of fabricating circuits in the embodiment. In this embodiment, unlike the one above, a first layer of circuit elements is formed in the silicon wafer, before the layers formed using the inventive crystallisation techniques.

The fabrication process started with SIMOX SOI wafers having initial silicon thickness of 1900 Å and was thinned down to 1100 Å by oxidation and subsequent oxide removal by HF. The top silicon layer was patterned, etched until the buried oxide was exposed and formed the active area of devices. Standard SOI CMOS process such as threshold channel implant, gate oxide growth, the formation of poly-silicon gate electrode, source/drain implantation and dopant activation annealing were performed. The first layer of devices was constructed. 8000 Å of low temperature oxide (LTO) was deposited, planarized by chemical and mechanical polish (CMP) and etch-back. The final interlayer oxide was 5000 Å thick.

The second layer of devices was built on the top of this oxide. 1000 Å of amorphous silicon was then deposited and re-crystallized by MILC. The trace nickel was deposited on the amorphous silicon film at the appropriate seeding window. The film was then annealed laterally and crystalllized at 560° C. for 60 hours in $N_2$ ambient. When the nickel was removed, the film was recrystallized at 900° C. for an hour. The grain size of this LPSOI layer was found to be over 80 $\mu$m. The devices on the second layer were fabricated with standard SOI CMOS process similar tot he first layer. Finally, contact and interconnect process were performed to complete the 3-D structure. Single layer metallization was used for the purpose of simple fabrication process. Silicide process was not performed in the work and lead to relatively high parasitic resistance. However, it does not affect the generality of our result obtained.

The channel lengths of the bottom layer MSFETs and topy layer MOSFETs are 0.54 and 0.71 $\mu$m respectively, and the characteristics of transistors on the two layers are very similar. The top layer devices, which are built on the LPSOI layer, do not have large leakage current or poor subthreshold factor. This suggests that the devices are constructed on the large, single silicon crystal without encounter any grain boundaries. The quality of the transistors fabricated on the LPSOI layer can be further demonstrated by comparing the mobility of NMOSFETs and PMOSFETs on the different layers. Both top layer LPSOI and bottom layer SOI devices have similar carrier mobilities.

FIGS. 5(*a*) and 5(*b*) show the $I_d$-$V_d$ characteristics of the bottom and top layer devices respectively. All the transistors exhibit SOI behaviors and can operate at low voltage supply. Low voltage, low power circuits can be realized. 3-D circuit can be constructed by different combinations of the top and bottom layer devices.

Table 1 is a comparison of the performance of the MOSFETs produced by the embodiment, with a thin film transistor produced by known MILC, and a high temperature thin film transistor produced without MILC. In the table $t_{ox}$ represents the thickness of the oxide layer of the MOSFET.

TABLE 1

|  | Embodiment | TFT with prior art MILC | High temperature TFT without MILC |
| --- | --- | --- | --- |
| Threshold voltage | 0.4 V (at $t_{ox}$ = 15 nm) | 5 V (at $t_{ox}$ = 100 nm) | 03 V (at $t_{ox}$ = 15 nm) |
| Electron mobility | 331 $cm^2$/V-s | 80 $cm^2$/V-s | 90 $cm^2$/V-s |
| Sub-threshold mobility | 110 mV/dec | 2.1 V/dec | 420 mV/dec |
| $I_{dsat}$ (at W/L = 15/5, $V_G$ = 3 V) | 0.5 mA | 2.1(A | 2.6(A |

Here $t_{ox}$ refers to the gate oxide thickness, $I_{dsat}$ saturation drain current, W is the transistor width, L is the transistor length, and $V_G$ is the applied gate voltage.

Turning to FIG. 6, an exemplary application of the invention is illustrated, in which the invention is used to form circuit elements for a MEMS system. Specifically the MEMS system is a electrochemiluminescence microcell of the kind having a chamber 51 through which light propagates to a photodiode 53 including circuit elements formed according to the invention (e.g. as in the preferred embodiment described above), in a large-grain polysilicon-on-insulator film (LPSOI) 55. The MEMS further includes a transistor 57 formed using the invention with a LPSOI film. The MEMS is for interaction with a magnet indicated as 59.

REFERENCES

The following references are incorporated herein in their entirety:

[1] K. Yamazaki, Y. Itoh, A. Wada, K. Morimoto and Y. Tomita, "4-layer 3-D IC technologies for parallel signal processing", 1990 IEDM, P599–602, 1990.

[2] S. J. Abou-Samra, P. A. Aisa, A. Guyot and B. Courtois, "3-D MOS SOI for High Performance Computing", 1998 Low Power Electronics and Design Proceedings, p54–58, 1998.

[3] V. Subramanian, K. C. Saraswat, "High-Performance Germanium-Seeded Laterally Crystallized TFTs for Vertical Device Integration", IEEE Trans. Elec. Devices, Vol. 45, No. 9, p1934–1939, 1998.

[4] S. Jagar, M. Chan, M. C. Chan, H. Wang, M. Qin, P. K. Ko, Y. Wang, "Single Grain Thin Film Transistors (TFT) with SOI CMOS performance formed by metal induced lateral crystallisation", IEEE 1999 International Electron Device Meeting (IEDM), p293–296, 1999.

[5] Yun-Thai Hsueh, Scott. D. Collins, Rosemary L. Smith, "DNA quantification with an electrochemiluminescence microscell", Sensors and Actuators B, p 1–4, 1988, Elsevier Science.

What is claimed is:

1. A method of forming a semiconductor device, the method comprising:

forming a layer of amorphous semiconductor on a surface, forming a plurality of metal strips contacting the amorphous semiconductor, and performing metal induced lateral crystallization of the amorphous semiconductor, the metal induced lateral crystallization including a first annealing phase at a first temperature and for a first time period whereby each metal strip forms a respective semiconductor crystal in a region defined by a side of one of said strips, and a second annealing phase at a second temperature which is higher than the first temperature and for a second time period which is shorter than the first time period, and fabricating a semiconductor device on a said semiconductor crystal.

2. A method according to claim 1 further including a step of patterning the semi-conductor layer.

3. A method according to claim 2 in which the patterning step is performed after the second annealing phase.

4. A method according to claim 2 in which the patterning step is performed between the first and second annealing phases.

5. A method according to claim 2 in which the patterning step is performed before the first annealing phase.

6. A method of forming semiconductor crystals on a surface, the method comprising:

forming a layer of amorphous semiconductor on the surface;

removing portions of the semiconductor layer to form a plurality of islands; and performing metal induced lateral crystallization of the islands to transform each island into a single respective semiconductor crystal.

7. A method according to claim 6 in which the metal induced lateral crystallization includes a first annealing phase at a first temperature and for a first time period whereby each metal strip forms a respective semiconductor crystal, and a second annealing phase at a second temperature which is higher than the first temperature and for a second time period which is shorter than the first time period.

8. A method of forming an integrated circuit, the method comprising:

(a) forming a layer of amorphous semiconductor on a surface;

(b) forming a plurality of semiconductor crystals within the layer at predetermined locations on the surface by forming a plurality of metal strips along sides of respective ones of said predetermined locations and contacting the amorphous semiconductor, and performing metal induced lateral crystallization using the plurality of metal regions to form substantially single semiconductor crystals at each of said locations; and (c) forming a plurality of electronic circuit elements within the layer at locations corresponding to the locations of the crystals.

9. A method according to claim 8 in which the step of forming a plurality of semiconductor crystals is performed by:

removing sections of the amorphous semiconductor layer to leave islands at the predetermined locations, and performing metal induced lateral crystallization to form each island into a semiconductor crystal.

10. A method according to claim 8 further comprising forming respective electronic circuit elements in respective crystals.

11. A method according to claim 8 comprising forming corresponding semiconductor regions in a plurality of the crystals, electrically connecting the corresponding regions to form a electronic circuit elements composed of a plurality of said crystals.

12. A method according to claim 8 in which an insulating layer is formed over the layer of electronic circuit elements, the steps (a) to (c) are repeated at least once to form a second layer including a second plurality of semiconductor crystals, and a second plurality of electronic circuit elements are formed in the second plurality of semiconductor crystals.

13. A method according to claim 12 in which the locations of the second electronic devices correspond to the locations of the second plurality of semiconductor crystals.

14. A method according to claim 8 in which said surface is an insulating layer covering a semiconductor body having electronic circuit elements formed therein.

15. A method according to claim 8 in which the integrated circuit is a micro-electronic mechanical system.

16. A method according to claim 8 in which the metal induced lateral crystallization includes a first phase of crystallization while the metal is present and a second phase of crystallization after the metal is removed.

17. A method according to claim 16 in which the second phase of crystallization is performed at a higher temperature than the first phase of crystallization.

18. An integrated circuit comprising a first layer formed on an insulating surface and containing a plurality of semiconductor crystal grains, the first layer further including a plurality of electronic circuit elements formed within respective crystal grains, a second layer that covers said first layer and contains a second plurality of semiconductor crystal grains, and at least one electronic circuit element formed in the second plurality of semiconductor crystal grains and electrically connected to an electronic circuit element in said first layer.

19. An integrated circuit according to claim 18 in which the insulating surface is a surface of an insulating layer formed on a semiconductor body, the semiconductor body including at least one electronic circuit element.

20. An integrated circuit comprising a layer formed on an insulating surface and containing a plurality of semiconductor crystal grains, the layer further including at least one circuit element which has a plurality of sets of semiconductor regions, the regions of each set being electrically connected to each other, and different ones of the crystal grains each containing one of said sets of regions.

21. An integrated circuit according to claim 20 which the electronic circuit is a MOSFET having a gate, a source and a drain, a first said set of regions collectively constituting the gate of the MOSTFET, a second said set of regions collectively constituting the source of the MOSFET, and a third said set of regions collectively constituting the drain of the MOSFET.

22. An integrated circuit according to claim 20 in which the layer is covered by an insulating layer, and the insulating layer is covered by a second layer containing a second plurality of semiconductor crystal grains, at least one electronic circuit element being formed in the second plurality of semiconductor crystal grains.

23. An integrated circuit according to claim 20 in which the insulating surface is a surface of an insulating layer formed on a semiconductor body, the semiconductor body including at least one electronic circuit element.

* * * * *